(12) United States Patent
Meijer

(10) Patent No.: US 9,030,675 B2
(45) Date of Patent: May 12, 2015

(54) METHOD FOR DETERMINING A DISTANCE BETWEEN TWO BEAMLETS IN A MULTI-BEAMLET EXPOSURE APPARATUS

(75) Inventor: Jan Andries Meijer, Rotterdam (NL)

(73) Assignee: Mapper Lithography IP B.V., Delft (NL)

( * ) Notice: Subject to any disclaimer, the term of this patent is extended or adjusted under 35 U.S.C. 154(b) by 165 days.

(21) Appl. No.: 13/295,159

(22) Filed: Nov. 14, 2011

(65) Prior Publication Data

US 2012/0293810 A1 Nov. 22, 2012

Related U.S. Application Data

(60) Provisional application No. 61/413,396, filed on Nov. 13, 2010, provisional application No. 61/414,459, filed on Nov. 17, 2010.

(51) Int. Cl.
*G01B 11/14* (2006.01)
*H01J 37/304* (2006.01)
(Continued)

(52) U.S. Cl.
CPC .............. *H01J 37/3045* (2013.01); *B82Y 10/00* (2013.01); *B82Y 40/00* (2013.01); *H01J 37/224* (2013.01); *H01J 37/244* (2013.01); *H01J 37/3177* (2013.01); *H01J 2237/2445* (2013.01);
(Continued)

(58) Field of Classification Search
USPC ................ 356/623, 121; 250/311, 369, 491.1
See application file for complete search history.

(56) References Cited

U.S. PATENT DOCUMENTS

| 4,814,615 A | * | 3/1989 | Fushimi et al. | 250/311 |
| 5,136,169 A | * | 8/1992 | Smith et al. | 250/491.1 |

(Continued)

FOREIGN PATENT DOCUMENTS

| CN | 1909191 A | 2/2007 |
| CN | 1936703 A | 3/2007 |

(Continued)

OTHER PUBLICATIONS

Wieland et al, "Throughput Enhancement Technique for Mapper Maskless Lithography", IP.com Journal, IP.com Inc., Feb. 10, 2010.

(Continued)

*Primary Examiner* — Tarifur Howdhury
*Assistant Examiner* — Isiaka Akanbi
(74) *Attorney, Agent, or Firm* — Hoyng Monegier LLP; David P. Owen

(57) ABSTRACT

The invention relates to a method for determining a distance between charged particle beamlets in a multi-beamlet exposure apparatus. The apparatus is provided with a sensor comprising a converter element for converting charged particle energy into light and a light sensitive detector provided with a two-dimensional pattern of beamlet blocking and non-blocking regions. The method comprises scanning a first beamlet over the pattern, receiving light generated by the converter element, and converting the received light into a first signal. Then the two-dimensional pattern and the first beamlet are moved relatively with respect to each other over a predetermined distance. Subsequently, the method comprises scanning a second beamlet over the pattern, receiving light generated by the converter element, and converting the received light into a second signal. Finally, the distance between the first beamlet and second beamlet is determined based on the first signal, the second signal and the predetermined distance.

27 Claims, 5 Drawing Sheets

(51) Int. Cl.
*B82Y 10/00* (2011.01)
*B82Y 40/00* (2011.01)
*H01J 37/22* (2006.01)
*H01J 37/244* (2006.01)
*H01J 37/317* (2006.01)

(52) U.S. Cl.
CPC ............ H01J2237/2446 (2013.01); H01J 2237/24578 (2013.01); H01J 2237/30433 (2013.01)

(56) References Cited

U.S. PATENT DOCUMENTS

| | | | |
|---|---|---|---|
| 5,872,618 A | 2/1999 | Nagayama et al. | |
| 5,892,230 A * | 4/1999 | Goodberlet et al. | 250/361 R |
| 6,496,665 B2 | 12/2002 | Umezawa et al. | |
| 6,791,094 B1 | 9/2004 | Olson et al. | |
| 6,958,804 B2 | 10/2005 | Wieland et al. | |
| 7,521,685 B2 * | 4/2009 | Hennessy et al. | 250/370.11 |
| 2004/0119024 A1 | 6/2004 | Avnery | |
| 2007/0032002 A1 | 2/2007 | Nonaka et al. | |
| 2007/0057204 A1 | 3/2007 | Kruit et al. | |
| 2009/0242807 A1 | 10/2009 | Tsuruta et al. | |

FOREIGN PATENT DOCUMENTS

| | | |
|---|---|---|
| EP | 0049799 A2 | 4/1982 |
| JP | 2005347054 A2 | 12/2005 |
| WO | 2011117253 A1 | 9/2011 |

OTHER PUBLICATIONS

S. Basin et al, "Technique to automatically measure electron-beam diameter and astigmatism", J. Vac. Sci. Technol. B 24(6), Nov./Dec. 2006.

K. Kadela et al, "X-Ray Masks With Tungsten Absorbers for use in the LIGA Process", Microelectronic Engineering 21 (1993) 123-126, Elsevier.

M. Pang et al, "Thin Film Fracture During Nanoindentation of Hard-Film", Mechanical and Materials Engineering, Washington State University, Pullman WA 99164-2920, 2002.

G. Winograd, "Demonstration of multiblanker electron-beam technology", J. Vac. Sci. Technol. B 18(6), Nov./Dec. 2000.

* cited by examiner

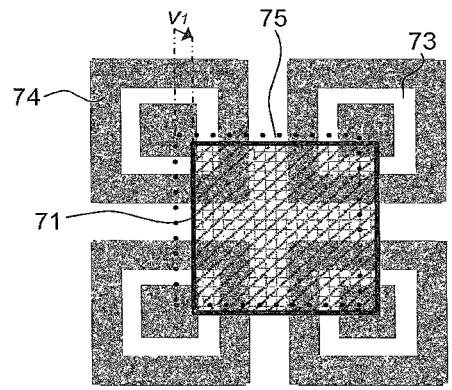
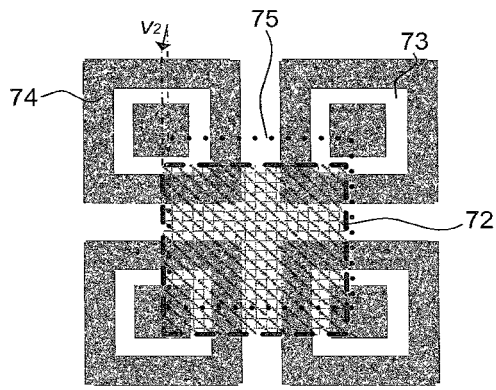
FIG. 8A  FIG. 8B
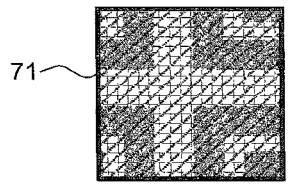  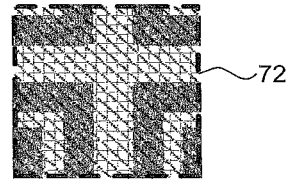
FIG. 9A  FIG. 9B
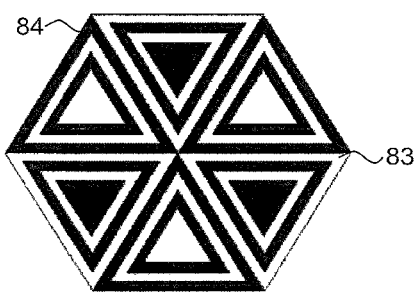 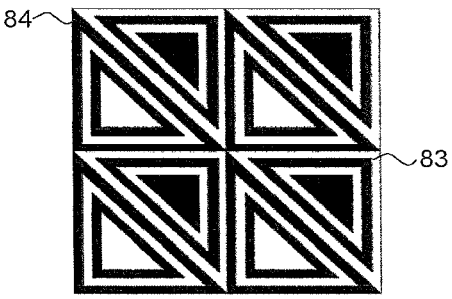
FIG. 10A  FIG. 10B
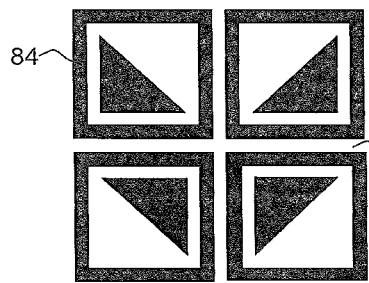 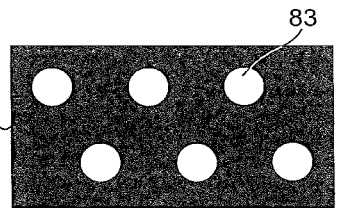
FIG. 10C  FIG. 10D

METHOD FOR DETERMINING A DISTANCE BETWEEN TWO BEAMLETS IN A MULTI-BEAMLET EXPOSURE APPARATUS

BACKGROUND OF THE INVENTION

1. Field of the Invention

The present invention relates to a method for determining a distance between two charged particle beamlets in a multi-beamlet exposure apparatus.

2. Description of the Related Art

In order to transfer a pattern onto the target surface, the controllable blocking of beamlets in combination with their movement over the target surface is performed in accordance with modulation information. An example of a multiple charged-particle beamlet lithography system is described in U.S. Pat. No. 6,958,804, which disclosure is herewith incorporated by reference in its entirety.

Such lithography systems can have very large numbers of beamlets, i.e. in the order of 10,000 or higher, for example 13,000. Future designs even envisage numbers in the order of 1,000,000 beamlets. It is a general aim for current electron beam lithography systems to be able to pattern a target surface in high-resolution, with some applications being capable of imaging patterns with a critical dimension of well below 100 nm feature sizes.

For such multiple beamlet, high-resolution lithography systems to be commercially viable low error margins of the lithography industry need to be met. Therefore it is important that the position of each one of the charged particle beamlets is precisely known and controlled. Due to various circumstances, such as manufacturing tolerances and thermal drift, such positions may however deviate from their expected and desired positions, which may render these deviating beamlets invalid for accurate patterning.

In conventional lithography systems, the position of each beamlet is determined by frequent measurement of the beamlet position. With knowledge of the beamlet position the beamlet can be shifted to the correct position.

Known beamlet position calibration methods generally comprise at least three steps: a measuring step in which the position of the beamlet is measured, a calculating step in which the measured position of the beamlet is compared to the desired expected position of that beamlet, and a compensation step in which the difference between the measured position and the desired position is compensated for. Compensation may be performed either in the software or in the hardware of the lithography system.

It is desirable to determine beamlet position during operation of a lithography system to allow for early position calibration to improve the target surface patterning accuracy. In order to limit negative effects on throughput, i.e. the number of target surfaces that can be patterned within a predetermined period of time, it is desirable that the method of measuring the position of the charged particle beamlets can be carried out within a limited period of time without sacrificing accuracy.

A sensor for measuring properties of a large number of charged-particle beamlets, in particular for charged particle beamlets used in a lithography system, is known from US published patent application 2007/057204 assigned to the present applicant, the content of which is herewith incorporated by reference in its entirety.

US 2007/057204 describes a sensor and method in which charged-particle beamlets are scanned over a converter element provided with a pattern of charged particle blocking and non-blocking areas. The beam portions that are impinging on the non-blocking areas are converted by the converter element into light beams. The converter may be a fluorescent screen or a doped YAG material. Subsequently, the light beams are detected by an array of light sensitive detectors such as diodes, CCD or CMOS devices. A relatively fast measurement can be achieved by reading out a large number of light sensitive detectors in a single operation. Additionally, the sensor structure, in particular the array of light detectors, enables a very small pitch of a multiplicity of beams to be measured without the necessity of unduly large structural measures in the region of the stage part of a lithography system. The beam separation is determined by comparison of a nominal pattern, i.e. the predefined image used when producing a pattern, with the measured scan result wherein every beam is scanning its own delimited area on the sensor surface.

However, in view of the continuously increasing demands of the industry regarding small dimensions without loss of throughput, there remains a need to provide even swifter and more accurate devices and techniques for measurement of beamlet properties in lithography systems, particularly in lithography machines comprising a large number of charged-particle beamlets that are designed to offer a high throughput. The higher accuracy is advantageous for increasing the resolution of a lithography machine. In particular it is favourable when using stitching, a technique where two beams write on the same area of the wafer to correct for writing failures. The beam separation needs to be known with nanometer precision for this technique. Furthermore, there is a need to be aware of the absolute position of the beamlets.

BRIEF SUMMARY OF THE INVENTION

An object of the present invention relates to improving the accuracy of a beam separation measurement between two beamlets in a multi-beamlet lithography system. For this purpose, the present invention provides a method for determining a distance between two charged particle beamlets in a multi-beamlet exposure apparatus provided with a sensor comprising a converter element for converting the energy of charged particles into light and a light sensitive detector, the converter element being provided with a sensor surface area provided with a two-dimensional pattern of beamlet blocking and non-blocking regions, the method comprising: scanning a first beamlet over the two-dimensional pattern; receiving light generated by the converter element in response to charged particles being part of the first beamlet transmitted through the two-dimensional pattern; converting the received light into a first signal by means of the light sensitive detector; shifting the two-dimensional pattern with respect to the first beamlet over a predetermined distance; scanning a second beamlet over the two-dimensional pattern; receiving light generated by the converter element in response to charged particles being part of the second beamlet transmitted through the two-dimensional pattern; converting the received light into a second signal by means of the light sensitive detector; determining the distance between the first beamlet and second beamlet based on the first signal, the second signal and the predetermined distance.

In some embodiments, the first signal and the second signal are directly compared. Because both beamlets scan the same area on the sensor surface, their signals are alike except for a spatial shift that corresponds to a deviation from their nominal separation. Comparing the two signals obtained from the two beamlet scans would thus reveal such deviation. Addition of the deviation to the nominal distance between the distance would then result in the actual distance between the beamlets. Using information obtained on the same area by scanning separate beams makes the method significantly less vulnerable to pattern irregularities, i.e. deviations from the nominal pattern.

In some other embodiments, the distance between the two beams is determined by comparing the first signal and the second signal with a nominal signal. Subsequently, the deviation from the nominal signal for both beamlets is taken into account while determining the actual beamlet separation. In these embodiments, although the accuracy of the determined beamlet positions for each beamlet is sensitive to pattern irregularities, the difference between the two positions is almost insensitive to such pattern irregularities. As a result, a substantial amount of accuracy loss is effectively removed. In addition, automated calculation is relatively easy because the nominal pattern is noise free.

BRIEF DESCRIPTION OF THE DRAWINGS

The features and advantages of the invention will be appreciated upon reference to the following drawings, in which:

FIGS. 8A, 8B exemplarily show coverage areas of two different charged particle beamlets while placed at the same position on top of the blocking pattern of FIG. 7;

FIGS. 9A, 9B schematically show the coverage areas of two different charged particle beamlets as obtained in FIGS. 8A, 8B respectively;

FIGS. 10A-10D schematically show yet other two-dimensional blocking patterns that may be used in embodiments of the invention;

DESCRIPTION OF ILLUSTRATIVE EMBODIMENTS

The following is a description of certain embodiments of the invention, given by way of example only and with reference to the drawings.

Figure 1:
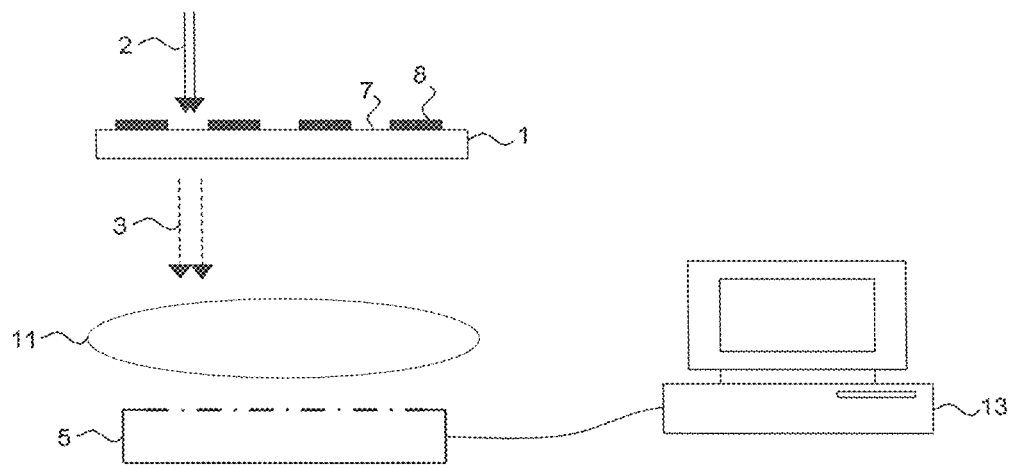
FIG. 1 schematically shows the concept of a sensor using a substrate converting charged particles into photons.

FIG. 1 schematically shows the operation of a sensor for determining a beam position of charged particle beamlets. The sensor comprises a converter element 1 and a light receptor 5. The converter element is provided with a pattern comprising charged particle blocking regions 8 and charged particle transmissive regions 7, further referred to as non-blocking regions. The converter element 1 is arranged for receiving charged particles 2 and generating photons in response, further referred to as light 3. The light 3 may be directed towards the photon receptor 5 by means of an optical system 11. The photon receptor 5 is communicatively coupled to a calculation unit, e.g. a computer 13 for determining the beam position of charged particles 2.

The converter element 1 may take the form of a fluorescent element, for example a fluorescent screen, or a scintillating element, for example a substrate of a doped yttrium aluminum garnet (YAG) material. Hereafter, embodiments of the invention will be described in with a YAG-screen being used as converter element 1, where the YAG-screen may be referred to as YAG 1.

The light receptor 5 may include any suitable light sensitive detector, such as a plurality of diodes, charged coupled device (CCD) cameras or complementary metal-oxide semiconductor (CMOS) cameras. Hereafter, the photon receptor 5 may be referred to as camera 5. Additionally, although embodiments of the invention may be used with respect to other types of charged particles, hereafter, embodiments of the invention will be discussed with reference to electrons.

In electron beamlet devices where the beamlet size is in the nanometer range, for example electron microscopes, electron beam lithography apparatus, and electron beam pattern generators, direct observation of light created by conversion by the converter element 1 is insufficient to enable determination of characteristics such as position of an electron beamlet as the resolution is limited by the wavelength of the converter element 1. To improve accuracy, an electron beamlet may be scanned across an electron blocking structure provided with sharp edges, further referred to as knife edges. An example of a sensor using a converter element provided with a knife edge is described in patent application US 2007/057204.

Figure 2A:
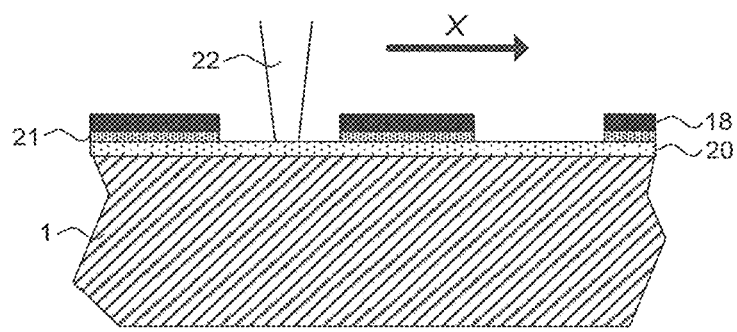
FIG. 2A schematically shows a cross-section of a converter element provided with a blocking structure.

FIG. 2A schematically shows a cross-section of a YAG 1 comprising an electron beamlet receiving surface provided with an electron blocking structure. The electron blocking structure comprises electron blocking regions provided with a layer 18 capable of blocking electrons. The blocking layer 18 may be a metal layer. A suitable metal for blocking electrons is tungsten. In between the blocking regions are non-blocking regions. An electron beam 22 impinging onto a non-blocking region of the electron blocking structure actually impinges onto the surface of the YAG 1 or a coating on the surface of the YAG.

Within the portions for blocking electrons, besides the blocking layer 18 an additional layer 21 may be present. The additional layer 21 may be a metal layer, and may serve the purpose of increasing the edge sharpness of the blocking layer 18. This is achieved by choosing an additional layer material that is resistant to the blocking layer etching process. When tungsten is chosen as the blocking layer material, a suitable material for the additional layer 21 is chrome.

The YAG 1 may be coated with a conducting coating layer 20. The purpose of this coating is to prevent charging of the YAG as a result of the incoming charged particle beamlets. The coating could also be used for blocking background radiation. Suitable materials for the coating layer 20 include aluminum and titanium.

As mentioned earlier, in order to determine the position of an electron beam 22, the electron beam 22 may be scanned over a blocking structure provided on the YAG 1 (in FIG. 2A in a direction denoted as X-direction). In response, light generated within the YAG 1 may be detected by a camera. An exemplary result of such scanning and detection action is schematically depicted in FIG. 2B.

Figure 2B:
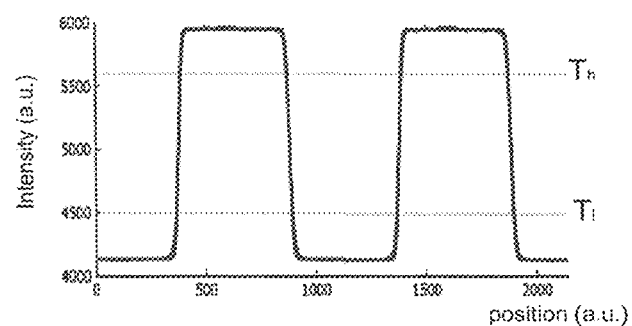
FIG. 2B represents a graph showing the transmitted intensity as a function of position for the blocking structure of FIG. 2A.

FIG. 2B shows a graph representing intensity of light emitted by a converter element 1 as a function of x-position of an electron beam 22 over the surface of the converter element 1. A maximum response is observed when electron beam 22 is entirely positioned in a non-blocking region, and minimal light is generated if the electron beam 22 is positioned entirely on top of a blocking region. The crossing of a knife edge results in a steep change of light intensity.

Upon scanning an electron beam in a predetermined direction, the electron beamlet may encounter two types of situations while crossing a knife edge. In a first situation, the beamlet experiences a transition from a blocking region to a non-blocking region. In a second situation, the beamlet experiences a transition from a non-blocking region to a blocking region.

Knife edges being encountered during a transition that corresponds to the first situation may be referred to as knife edges of a first type. Similarly, knife edges being encountered during a transition that corresponds to the second situation may be referred to as knife edges of a second type. The type of knife edge is thus dependent on the scanning direction of the beamlet to be measured. If reference is made to "knife edges of similar type", this means that all the knife edges involved either relate to knife edges of the first type or relate to knife edges of the second type.

Knowledge of the knife edge pattern provided on the electron-receiving surface of the converter element surface allows for the determination of a beam position. The beamlet position can be measured by scanning the beamlet across the surface of the converter element in the x-direction and measuring the position at which the intensity of light emitted by a converter element changes from a maximum to a minimum value or from a minimum to a maximum value, as shown in FIG. 2B. For example, when the intensity changes from maximum to minimum value, this indicates that the beamlet is scanned over a knife edge transitioning from a non-blocking region to a blocking region in the x direction. However, there may be uncertainty as to which knife edge the beamlet is located at.

Note that the measurement shown in FIG. 2B, and the discussion of beamlet position measurements relates to a beamlet having dimensions that are smaller than the widths of the blocking and non-blocking regions involved. These dimensions and widths are taken along a direction parallel to the scan direction being used.

Figure 3:
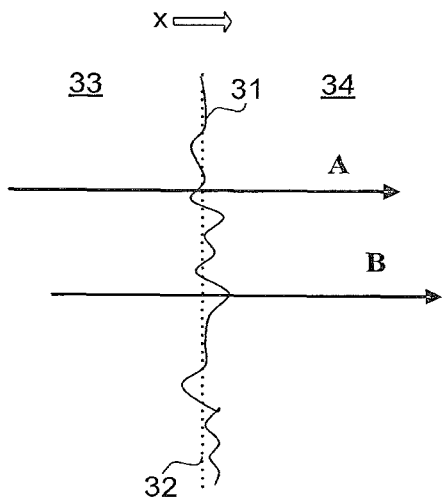
FIG. 3 schematically shows a problem related to line edge roughness.

In many applications, a single knife edge is not suitable to obtain beamlet characteristics with sufficient accuracy. In particular so-called line edge roughness of a knife edge (LER) may limit the accuracy of beamlet measurements. FIG. 3 schematically illustrates a problem related to LER. In FIG. 3, a sensor is arranged to detect the intensity of a beamlet being moved across a knife edge 31 separating an electron blocking region 33 and an electron non-blocking region 34. The knife edge 31 is designed to have the orientation and shape as denoted by the dotted line 32.

If the x-position of the beamlet is detected under the assumption that it follows a trajectory A across the knife edge 31 from the blocking region 33 towards the non-blocking region 34, while in reality the trajectory B is followed, the beamlet position measurement in the scanning direction should give the same results for both trajectories. After all, both trajectories cross the dotted line 32 at the same x-position. However, as can be readily seen in FIG. 3, due to the line edge roughness of the knife edge 31, the measured x-position of the beamlet for trajectory A will be different than the measured x-position for trajectory B. In this example, determining the x-position based on the crossing of single knife edge 31 provides an inaccurate result.

Figure 4:
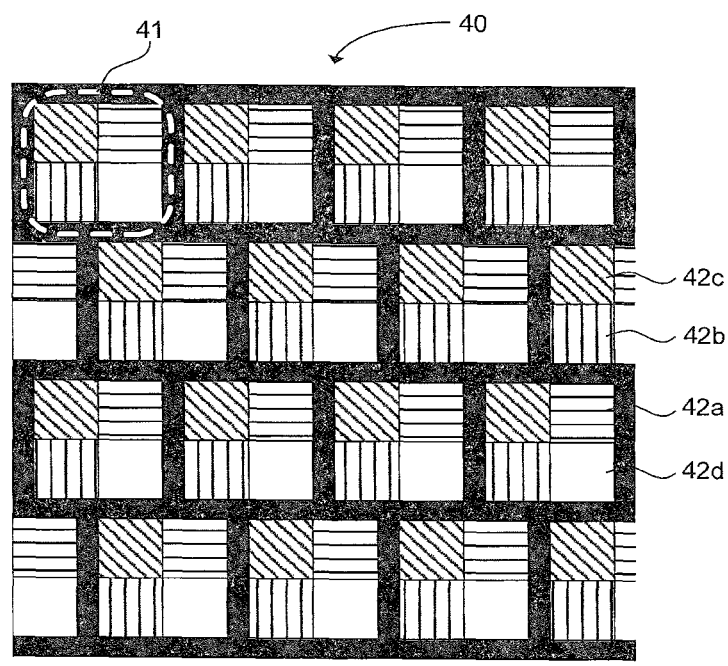
FIG. 4 schematically shows a top view of a blocking structure that may be used in embodiments of the invention.

FIG. 4 schematically shows a top view of a blocking structure 40 that may be used in some embodiments of the invention. The blocking structure 40 comprises a plurality of cells 41. The cells 41 are arranged to evaluate individual beamlets. Each cell 41 comprises a predetermined blocking pattern comprising different portions, the portions comprising different patterns of charged particle blocking structures forming multiple knife edges at transitions between blocking and non-blocking regions.

In the embodiment depicted in FIG. 4, each cell 41 comprises four portions, further referred to as quadrants 42a, 42b, 42c, 42d. Each quadrant may comprise one or more blocking patterns.

In the blocking structure 40 of FIG. 4, the first quadrant 42a comprises multiple knife edges with an orientation substantially parallel to each other in a first direction. Knife edges of similar type may be periodically spaced.

The second quadrant 42b comprises multiple knife edges with an orientation substantially parallel to each other in a second direction. Generally, the second direction is chosen to be different from the first direction. In the embodiment shown in FIG. 4, the first direction is substantially perpendicular to the second direction. The two quadrants 42a, 42b with substantially orthogonal knife edge patterns allow for independent measurements in the first and second direction. The third quadrant 42c of blocking structure 40 comprises multiple knife edges with an orientation parallel to each other in a third direction.

In FIG. 4, the fourth quadrant 42d of blocking structure 40 is not provided with any blocking structure. Alternatively, one or more of several blocking patterns may be provided in this quadrant. The option to provide different patterns in the fourth quadrant 42d opens the possibility to use a pattern in the fourth quadrant 42d that is most suitable to determine a different beamlet characteristic, such as beamlet size or shape. Thus, a cell can be designed having different areas for performing different types of measurements on the beamlets.

Preferably, the cell size is sufficiently large to reduce sensitivity to rotation misalignment of the sensor with respect to the plurality of beamlets. On the other hand the cell size is sufficiently small in view of the beam separation distance. In a charged particle apparatus using about 10,000 beamlets, such beam separation distance typically lies in the range from 75-200 micrometer.

Each cell 41 may correspond to a single beamlet whose characteristics are to be determined, the system comprising multiple cells measuring the characteristics of multiple beamlets at the same time. The layout of the cells preferably corresponds to the physical arrangement of the beamlets. In this way, beamlet characteristics can be measured in parallel which results in a relatively fast measurement. The number of cells 41 may exceed the number of beamlets so as to reduce alignment sensitivity of the sensor in the converter element surface plane. For example, the total beam containing area may be 1.5×1.5 mm² while the sensor cell containing area may be 3×3 mm². Alternatively, the number of cells may be less than the number of beamlets, and the beamlets may be measured in groups.

Figure 5A:
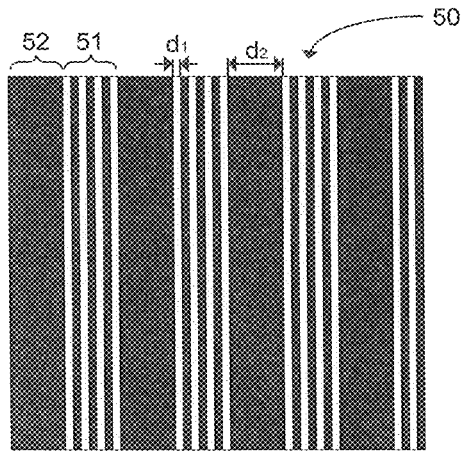
FIG. 5A schematically shows a one-dimensional blocking pattern that may be used in embodiments of the invention.

The knife edges may be equally spaced as shown in FIGS. 1 and 2 or may be spaced unequally as shown in FIG. 5A. In blocking pattern 50, knife edge structures are clustered in groups 51 to form gratings between wider non-blocking regions 52. Parallel knife edges of similar type within a group 51 are arranged at a first pitch $d_1$, which can be designed smaller than the spot size. The groups 51 are provided at a second pitch $d_2$ which is greater than the first pitch $d_1$ and greater than the spot size. The wider regions 52 may alternatively be blocking regions, or a combination of wide blocking and wide non-blocking regions may be used.

An arrangement of knife edges as shown in FIG. 5A as compared to knife edges in an equally spaced pattern as shown in FIGS. 1 and 2, offers many more transitions between beamlet blocking regions and non-blocking regions when scanning an electron beamlet over a predetermined distance. The increased number of transitions may help to improve measurement accuracy and increase measurement efficiency by providing a larger number of transitions per distance scanned and per scan time. For example, a beamlet position measurement may be less susceptible to line edge roughness due to the averaging of a large number of beamlet transitions.

Additionally or alternatively, in view of the higher density of transitions, the scan length, and with the same scan speed also the scan duration, can be reduced for obtaining sufficient measurement information. In other words, the efficiency of data acquisition and/or data processing may improve. A reduced scan duration may result in a better performance of a lithography apparatus as more time can be dedicated to exposure and less time is needed for calibration and/or alignment purposes.

Figure 5B:
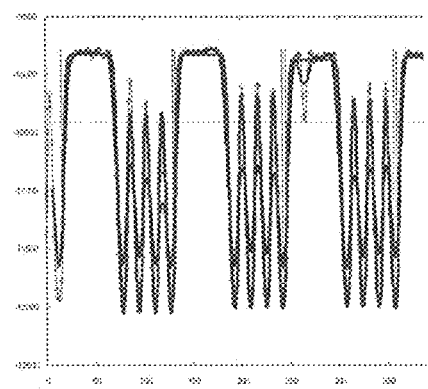
FIG. 5B represents an exemplary graph showing the transmitted intensity as a function of position for the blocking pattern of FIG. 5A.

FIG. 5B represents an exemplary graph showing the transmitted intensity as a beamlet is scanned across the blocking pattern of FIG. 5A. Because the blocking regions are not large enough to entirely block the electron beam, the minimum measured intensity does not correspond to the absence of the electron beam. However, it has been found that the presence of such large blocking regions is not necessary to derive the desired measurement results For example, if the beamlet size is considerably smaller than the width of a group of knife edges 51, the average intensity as measured while scanning the beamlet across the group provides a value that is approximately equal to half the maximum intensity of the electron beamlet. For this measurement, the width of blocking regions and non-blocking regions within a group of knife edges 51 are preferably smaller than the average diameter of the spot size of the beamlet to be measured.

Figure 6:
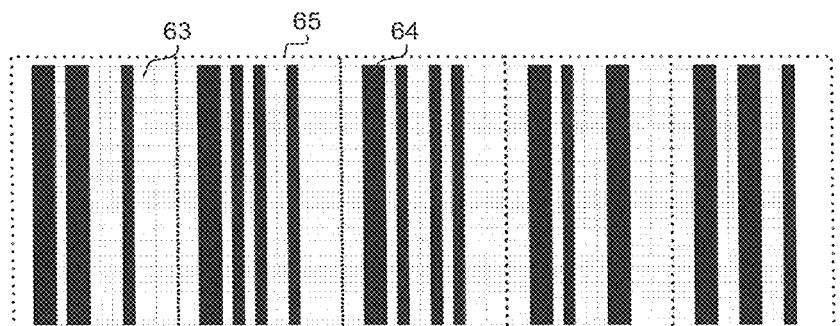
FIG. 6 schematically shows a top view of another one-dimensional blocking pattern that may be used in embodiments of the invention.

FIG. 6 schematically shows a top view of another blocking pattern comprising groups of knife edges 65, similar to the groups of knife edges 51 shown in FIG. 5A. However, the grating patterns within a group of knife edges 65 differ from each other in that the transitions between blocking and non-blocking regions along the predetermined scan trajectory over the surface is unique for each pattern. As a result, each grating pattern within a group 65 carries absolute position information. The blocking pattern shown in FIG. 6 can be used in any one of the quadrants 42a, 42b, 42c shown in FIG. 4, as well as in quadrant 42d.

In particular, the blocking pattern of FIG. 6 comprises blocking structures defining knife edges between blocking regions 64 and non-blocking regions 63, the knife edges forming groups of knife edges 65. Within each group 65, the blocking and non-blocking region widths and spacing distance between subsequent knife edges uniquely vary. The varied spacing distance and blocking and non-blocking widths enable a processor to determine an absolute position of a beamlet in a direction substantially perpendicular to the orientation of the knife edges within the blocking pattern. This determining may be achieved, for example, by scanning a beamlet across the blocking pattern and matching the detected pattern of intensity variation to a registered set of patterns of the knife widths and spacings.

One possible application of a beamlet position measurement, in particular in a multi-beamlet lithography apparatus, is to control stitching, i.e. to write at the same position on a target surface to be patterned with different beams at separate moments in time. In lithography applications, stitching requirements may be set with nanometer precision.

Theoretically, multiple beamlets in a multiple beamlet lithography apparatus or the like are spaced apart in accordance with a known design. As a result, the nominal vector distance, defined as the x and y coordinates of a hypothetically perfect system, between separate beamlets within the design is known. Note that the nominal vector distance may also be referred to throughout this document as the theoretical vector distance. This knowledge may be used to control stitching. However, due to practical limitations, the actual vector distance between beamlets will not be identical to the theoretical vector distance. As a result, so-called stitching errors may occur. A stitching error of a beamlet may be defined as the vector deviation between a nominal position and an actual position of a beamlet patterning a surface.

In some embodiments of the invention, a blocking pattern with knife edges is arranged to determine a deviation from a theoretical vector distance between two beamlets. In other words, the sensor is arranged to perform an actual beamlet separation measurement. Determining a deviation from a theoretical vector distance between two beamlets can be useful for predicting a stitching error resulting from patterning a target surface with a multi-beamlet exposure apparatus using the respective beamlets. If the deviation is known, adequate compensation can be arranged by amending control data of at least one of the respective beamlets.

Blocking patterns arranged to be scanned in one direction, for example provided with a number of parallel knife edges such as shown in FIGS. 5A and 6, are generally not suitable for determining a beam separation distance between two beamlets. This can be demonstrated with reference to FIG. 3. Consider that trajectory A is the trajectory followed by a first beamlet, and trajectory B is the trajectory followed by a second beamlet supposed to pattern the same positions as the first beamlet. Although limited by the inaccuracy due to line edge roughness discussed earlier, it may be possible to determine a difference in position in the scanning direction. However, there is no information available to determine an offset between the beamlets in a direction perpendicular to the scanning direction.

For this reason, it is desirable to use a two-dimensional blocking pattern for beam separation measurements. The two-dimensional blocking pattern preferably comprises a substantial length of the knife edges. It has been found that precision in fitting an image to a pattern derives from the positions of the knife edges separating blocking regions and non-blocking regions within the blocking pattern. For this reason, maximizing the knife edge length per unit surface area of the blocking pattern is desirable.

Alternatively or additionally, in order to avoid that no ambiguity arises with respect to the actual position of a beamlet being measured, it is desirable that no periodicity in the two-dimensional blocking pattern occurs within a small distance. Preferably, such distance is larger than twice the maximum beam separation distance between two beamlets.

A two-dimensional knife edge pattern may be used to provide information about a beamlet position in two dimensions. The (vertical) y-position of the beamlet may be determined by the pattern of transitions as the beamlet is scanned over the blocking pattern in the (horizontal) x-direction, these transitions being determined by the pattern of blocking and non-blocking regions along the scan path. Similarly, the x-position of the beamlet can be determined by the pattern of transitions as the beamlet is scanned in the y-direction.

Figure 7:
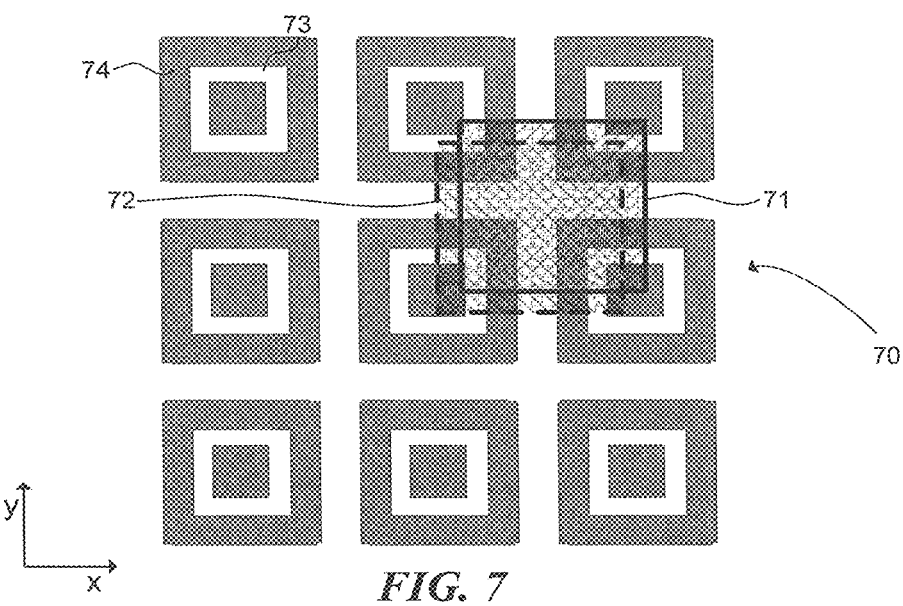
FIG. 7 schematically shows a two-dimensional blocking pattern that may be used in embodiments of the invention.

FIG. 7 schematically shows a top view of a two-dimensional blocking pattern that may be used. The two-dimensional blocking pattern may cover a portion, e.g. a quadrant, of the electron-receiving surface of the converter element. In FIG. 7, the squares 71, 72 with solid circumference and dashed circumference respectively, represent areas covered by two-dimensional scans performed with a first beamlet and a second beamlet respectively. The areas 73 represent non-blocking regions, and the areas 74 represent blocking regions. As the beamlets are controlled to scan the same area, the two squares 71, 72 should theoretically fully overlap. However, as demonstrated in FIG. 7, there is often an offset between the area scanned by the first beamlet and the area scanned by the second beamlet. This offset may result in stitching errors if both beamlets are required to pattern the same area on a target surface.

In order to be able to compensate for the offset between two beamlets, beamlet position measurements may be performed to determine a deviation of the theoretical vector distance between the two beamlets, i.e. the beam separation, in the plane of the charged particle receiving surface of the converter element. First, a first beamlet may be positioned at at least one theoretical predetermined position. For example, a plurality of measurement positions may be selected in a scan field, such that a predetermined area is scanned. Measurements may then be taken along scan lines covering that scan field, e.g. by two-dimensional scanning along a scanning trajectory such as a raster scan. At each selected measurement position, a first actual position of the first beamlet is measured. Subsequently, the second beamlet is positioned at the at least one theoretical predetermined position. Such positioning can be achieved by using knowledge regarding the theoretical vector distance between the first beamlet and the second beamlet. The one or more second actual positions are measured in a similar fashion as described with respect to the first beamlet. Based on the measured first and second positions, a deviation from the theoretical vector distance between the two beamlets can be determined.

In some embodiments, determining the vector distance between the two beamlets may comprise comparing actual measured positions with theoretical predetermined positions, so-called nominal positions. FIGS. 8A, 8B schematically illustrate the concept of such comparison. In FIGS. 8A, 8B, the theoretical predetermined area to be scanned by the beamlets is denoted by the dotted square 75. In FIG. 8A, the area 71 actually scanned with the first beamlet is compared with the theoretical predetermined area 75, and based on this comparison a first displacement vector $v_1$ is determined. Similarly, as shown in FIG. 8B, the area 72 actually scanned with the second beamlet is compared with the theoretical predetermined area 75, and based on the comparison a second displacement vector $v_2$ is determined.

Determining the beam separation between the first beamlet and the second beamlet may now be based on the first displacement vector $v_1$ and the second displacement vector $v_2$. The determining can be performed by vector addition of the two displacement vectors $v_1$, $v_2$. An advantage of comparing both actually measured areas with the nominal area is that the nominal area is not subject to degradation by noise.

In some embodiments, determining the vector distance between the two beamlets may comprise comparing the one or more measured actual positions of the first beamlet with the corresponding one or more measured actual positions of the second beamlet. FIGS. 9A, 9B schematically represent such a comparison, wherein FIG. 9A shows the actual area 71 scanned by the first beamlet and FIG. 9B shows the actual area 72 scanned by the second beamlet.

Based on this comparison, the deviation from the theoretical vector distance between the two beamlets can be determined. Using a direct comparison of the actual areas 71, 72 scanned by the first and second beamlet has the advantage that the operation is not vulnerable to pattern non-conformity, for example caused by line edge roughness. A small deformation in the nominal pattern has no severe effect as the deformation may be present in both actual areas 71, 72. As a result, direct comparison will eliminate the influence of this deformation on the determination of the deviation from the theoretical vector distance between the two beamlets.

Designs of two-dimensional patterns that may be used in some other embodiments of a sensor according to the invention are shown in FIGS. 10A-10D. The designs shown in FIGS. 10A-10C comprise diagonal knife edges. FIG. 10A shows a positive/negative blocking pattern with equilateral triangles, and FIG. 10B shows a similar pattern with right isosceles triangles. FIG. 10C shows a pattern combining squares and right isosceles triangles in various orientations, featuring large blocking and non-blocking regions. Beamlet separation up to L can be measured, where L is the side of one cell of the pattern. The choice of a suitable pattern may depend on the amount of detail, i.e. number of transitions, needed to optimize the analysis, may alternatively depend on criteria related to the easiness of producing a specific pattern.

FIG. 10D shows a pattern with a large blocking region 84 and circular non-blocking regions 83, i.e. a pattern formed by a blocking layer provided with non-blocking regions, in this particular case circular in shape. This design may be easy to manufacture and provides knife edges in all directions. However, this design does not have a high ratio of knife edge length per unit area.

Figure 11A:
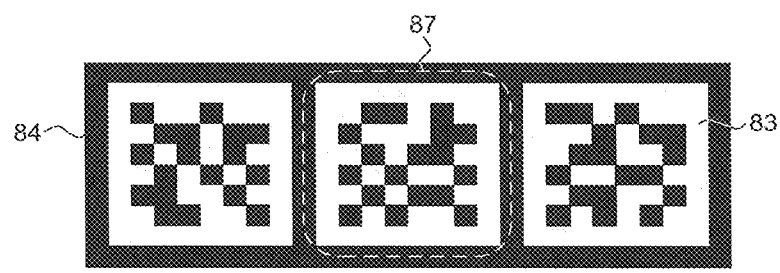
FIGS. 11A-11B schematically show yet other two-dimensional blocking patterns that may be used in embodiments of the invention.
Figure 11B:
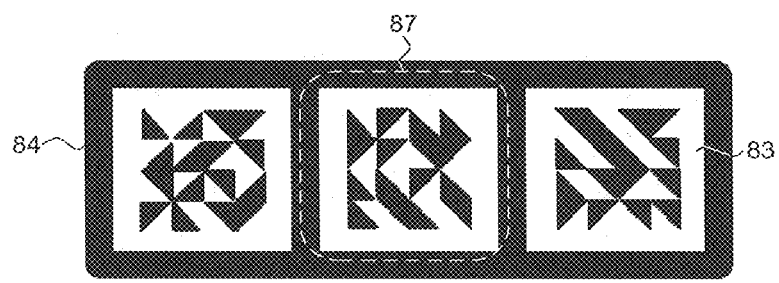

As discussed with reference to FIG. 6, in some applications it might be useful to identify an absolute position of a beamlet. FIGS. 11A, 11B schematically show examples of two-dimensional blocking pattern designs, suitable for use with other embodiments of the invention for defining an absolute position of a beamlet. The two-dimensional blocking pattern designs comprise a number of sub-cells 87. Similarly to the blocking pattern for use in a one-dimensional measurement, shown in FIG. 6, the pattern of alternating blocking and non-blocking regions along a horizontal path over the patterns shown in FIGS. 11A, 11B permits accurate determination of which sub-cell 87 the beamlet is occupying and where the beamlet is within the sub-cell 87. This is due to the unique pattern of each sub-cell 87, and the variation of the pattern within each sub-cell 87 in two directions, horizontal and vertical. This design permits approximately $2^x$ different "codes" for an n×n pattern cell, where $x=n^2-3$ in case an overall ratio of blocked to non-blocked area equals about 50% and there are not too many adjacent blocking or non-blocking regions within the pattern. Each code then represents a unique sub-cell pattern.

The blocking pattern of FIG. 11B combines the unique sub-cell pattern coding of FIG. 11A with the use of diagonal knife edges, to enable beamlet shape measurements. The triangle coding permits a large number of different codes in n×n pattern, where each triangle can have one of four possible orientations. Absolute position coding, for example provided by the designs in FIGS. 11A and 11B, is particularly useful when measuring large beam separations.

In some embodiments, two-dimensional blocking patterns as shown in FIGS. 11A, 11B may be used for a first estimate of the absolute position of a beamlet. Further improvement of the accuracy of the beamlet position determination may then be performed by using different blocking patterns, e.g. positioned at a different location on the sensor surface, e.g. in a different quadrant of a sensor cell 41.

It should be noted that any of the different types of blocking patterns shown in drawings and described above may be used in combination with one or more of the other patterns. For example, a converter element may be arranged with different types of blocking patterns formed on different areas of the converter so that beamlets may be scanned over different patterns to enable various measurements to be made. The different blocking patterns may be combined into cells, for example as shown in FIG. 4, with each quadrant of each cell having a selected blocking pattern. It should further be noted that inverting the blocking and non-blocking areas of any of the patterns described in this document has no influence on the measurement principle.

Figure 12:
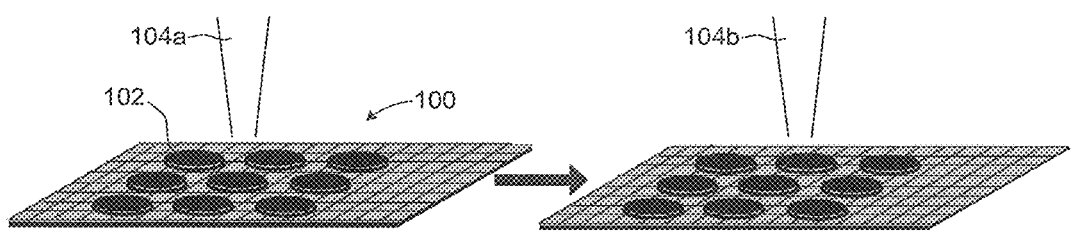
FIG. 12 schematically shows a use of a two-dimensional blocking pattern in a method for determining a distance between two beamlets according to an embodiment of the invention.

FIG. 12 schematically shows a method for determining a distance between two charged particle beamlets 104a, 104b by means of a sensor 100. The sensor 100 may be a sensor as discussed earlier. The sensor comprises a converter element for converting charged particles into light and a light sensitive detector. The converter element is provided with a sensor surface area provided with a two-dimensional pattern of beamlet blocking and non-blocking regions. Such pattern may correspond to any of the patterns discussed earlier, for example the pattern shown in FIG. 10D. In FIG. 12 the pattern is formed by an array of blocking structures 102 having a circular shape.

First, the first beamlet 104a is scanned over the two-dimensional pattern. Light generated by the converter element in response to charged particles being part of the first beamlet 104a transmitted through the two-dimensional pattern are then received by the light sensitive detector. The light sensitive detector is then arranged to convert the received light into a first signal. Generally, the signal is an electrical signal. In case of the use of a light sensitive detector comprising an array of light sensitive cells, for example a CCD, such a signal typically includes a continuous flow of signal values. The signal may be a multiplexed signal.

After scanning the first beamlet, the two-dimensional pattern is shifted with respect to the first beamlet over a predetermined distance, for example the nominal distance between the two beamlets 104a, 104b. In FIG. 12 the shifting is performed by moving the sensor with the two-dimensional pattern from a first position suitable for measuring the first beamlet 104a towards a second position suitable for measuring the second beamlet 104b.

The method shown in FIG. 12 continues by scanning the second beamlet 104b over the two-dimensional pattern. The light sensitive detector now receives light generated by the converter element in response to charged particles being part of the second beamlet 104b transmitted through the two-dimensional pattern. The light sensitive detector then converts the received light into a second signal.

Finally, the distance between the first beamlet 104a and the second beamlet 104b may be determined based on the first signal and the second signal. In addition, the predetermined distance is taken into account.

The invention has been described by reference to certain embodiments discussed above. It will be recognized that these embodiments are susceptible to various modifications and alternative forms well known to those of skill in the art. Further modifications in addition to those described above may be made to the structures and techniques described herein without departing from the spirit and scope of the invention. Accordingly, although specific embodiments have been described, these are examples only and are not limiting upon the scope of the invention, which is defined in the accompanying claims.

What is claimed is:

1. A method for determining a distance between two charged particle beamlets in a multi-beamlet exposure apparatus provided with a sensor comprising a converter element for converting the energy of charged particles into light and a light sensitive detector, the converter element being provided with a sensor surface area provided with a two-dimensional pattern of beamlet blocking and non-blocking regions, the method comprising:
   scanning a first beamlet over an area of the two-dimensional pattern;
   receiving light generated by the converter element in response to charged particles being part of the first beamlet transmitted through the two-dimensional pattern;
   converting the received light into a first signal by means of the light sensitive detector;
wherein the method, after scanning the first beamlet over the two-dimensional pattern, further comprises:
   relatively moving the two-dimensional pattern and the first beamlet with respect to each other over a predetermined distance;
   scanning a second beamlet over the area of the two-dimensional pattern;
   receiving light generated by the converter element in response to charged particles being part of the second beamlet transmitted through the two-dimensional pattern;
   converting the received light into a second signal by means of the light sensitive detector;
   determining the distance between the first beamlet and second beamlet based on the first signal, the second signal and the predetermined distance.

2. The method according to claim 1, wherein relatively moving the two-dimensional pattern and the first beamlet with respect to each other over the predetermined distance comprises moving the converter element over the predetermined distance, while the position of the first beamlet remains substantially stationary.

3. The method according to claim 1, wherein the multi-beamlet exposure apparatus comprises a beamlet generator, and wherein moving the two-dimensional pattern and the first beamlet with respect to each other over the predetermined distance comprises moving the first beamlet over the predetermined distance, while the position of the converter element remains substantially stationary.

4. The method according to claim 1, wherein the two-dimensional pattern comprises a plurality of pattern portions, each pattern portion being a unique two-dimensional pattern of blocking structures.

5. The method according to claim 1, wherein the two-dimensional pattern portion is divided in quadrants, and each quadrant is provided with a different predetermined pattern of blocking structures.

6. The method according to claim 1, wherein a number of distances between a number of beamlet pairs are determined simultaneously.

7. The method according to claim 6, wherein simultaneous determining of a number of distances between two beamlets comprises providing a two-dimensional pattern with a plurality of similar patterns suitably spaced apart to enable simultaneous scanning of a number of first beamlets over respective areas of the two-dimensional pattern, each area comprising one of the plurality of similar patterns, and, after said relatively moving, a simultaneous scanning of a number of second beamlets over the respective areas of the two-dimensional pattern.

8. The method according to claim 7, wherein the two-dimensional pattern comprises a blocking layer provided with non-blocking regions, preferably circular non-blocking regions.

9. The method according to claim 8, wherein the positions of the non-blocking regions have a pitch corresponding to the predetermined distance.

10. The method according to claim 1, wherein the two-dimensional pattern is divided into a plurality of cells for evaluating individual beamlets, each cell comprising a predetermined pattern.

11. The method according to claim 10, wherein each cell comprises a unique two-dimensional pattern of blocking structures.

12. The method according to claim 10, wherein each cell comprises a plurality of pattern portions, each pattern portion being a unique two-dimensional pattern of blocking structures.

13. The method according to claim 10, wherein each cell is divided in quadrants, and each quadrant is provided with a different predetermined pattern of blocking structures.

14. The method according to claim 10, wherein each cell comprises different portions, each portion comprising different patterns of charged particle blocking structure forming multiple knife edges at transitions between blocking and non-blocking regions along a predetermined beamlet scan trajectory over such portion.

15. The method according to claim 1, wherein the two-dimensional pattern comprises a blocking layer provided with non-blocking regions, preferably circular non-blocking regions.

16. The method according to claim 1, wherein determining the distance comprises comparing the first signal and the second signal.

17. The method according to claim 1, wherein determining the distance comprises:
comparing the first signal with a predefined nominal signal, and obtaining a first deviation;
comparing the second signal with the predefined nominal signal, and obtaining a second deviation;
comparing the first deviation and the second deviation.

18. The method according to claim 1, wherein the predetermined distance corresponds to a nominal distance between the first beamlet and the second beamlet.

19. A method for determining a deviation from a nominal vector distance between a first beamlet and a second beamlet in a single plane for use in a multi-beamlet exposure apparatus, the method comprising:
scanning the first beamlet over a two-dimensional blocking structure pattern comprising knife edges provided on a sensor surface, and obtaining first beamlet information;
displacing the two-dimensional blocking structure pattern with respect to the first beamlet over a distance corresponding to the nominal vector distance;
scanning the second beamlet over the two-dimensional blocking structure pattern, and obtaining second beamlet information;
determining the deviation from the nominal vector distance based on the first beamlet information and the second beamlet information.

20. The method according to claim 19, wherein displacing is performed by displacing the two-dimensional blocking structure pattern over a distance corresponding to the nominal vector distance.

21. The method according to claim 19, wherein determining the deviation from the nominal vector distance comprises comparing the first beamlet information and the second beamlet information.

22. The method according to claim 19, wherein determining the deviation from the nominal vector distance comprises:
comparing the first beamlet information with predefined nominal beamlet information, and obtaining a first beamlet deviation;
comparing the second beamlet information with the predefined nominal information, and obtaining a second beamlet deviation;
comparing the first beamlet deviation and the second beamlet deviation.

23. The method according to claim 19, wherein first beamlet information and the second beamlet information include actual positions of the first beamlet and the second beamlet respectively.

24. The method according to claim 19, wherein the two-dimensional pattern comprises a blocking layer provided with non-blocking regions, preferably circular non-blocking regions.

25. Multi-beamlet exposure apparatus for transferring a pattern onto a target surface by means of a plurality of beamlets, the apparatus comprising a sensor for measuring properties of the beamlets, the sensor being provided with a sensor surface area provided with a two-dimensional pattern of beamlet blocking and non-blocking regions, wherein the apparatus is configured to perform the method according to claim 19.

26. A sensor for determining a distance between a first charged particle beamlet and a second charged particle beamlet in a single plane for use in a multi-beamlet exposure apparatus, the sensor comprising:
a converter element for converting the energy of charged particles into light and
a light sensitive detector for receiving the light,
the converter element being provided with a sensor surface area provided with a two-dimensional pattern of beamlet blocking regions and non-blocking regions,
said two-dimensional pattern comprising a plurality of similar patterns suitably spaced apart to enable simultaneous scanning of a number of first charged particle beamlets and a simultaneous scanning of a number of second charged particle beamlets over the two-dimensional pattern, and
a blocking layer provided with said non-blocking regions, wherein the positions of the non-blocking regions have a pitch corresponding to a nominal vector distance between said two beamlets.

27. The sensor according to claim 26, wherein said non-blocking regions are circular.

* * * * *